United States Patent [19]

Pazos

[11] 3,901,705

[45] Aug. 26, 1975

[54] METHOD OF USING VARIABLE DEPTH PHOTOPOLYMERIZATION IMAGING SYSTEMS

[75] Inventor: Jose Francisco Pazos, Wilmington, Del.

[73] Assignee: E. I. Du Pont de Nemours and Company, Wilmington, Del.

[22] Filed: Sept. 6, 1973

[21] Appl. No.: 394,827

[52] U.S. Cl. .................... 96/35.1; 96/40; 96/115 P; 204/159.18; 204/159.23; 156/58

[51] Int. Cl.[2] .......................................... G03C 5/00

[58] Field of Search .................. 96/35.1, 115 P, 40; 204/159.18, 159.23; 156/58

[56] References Cited

UNITED STATES PATENTS

| | | | |
|---|---|---|---|
| 2,760,863 | 8/1956 | Plambeck | 96/115 P |
| 2,927,022 | 3/1960 | Martin et al. | 96/115 P |
| 3,060,022 | 10/1962 | Duerr | 96/115 P |
| 3,060,023 | 10/1962 | Burg | 96/115 P |
| 3,060,026 | 10/1962 | Heiart | 96/115 P |
| 3,203,801 | 8/1965 | Heiart | 96/87 |
| 3,625,696 | 12/1971 | Krauch et al. | 96/86 P |
| 3,661,588 | 5/1972 | Chang | 96/115 P |
| 3,740,224 | 6/1923 | Barzyski et al. | 96/33 |

OTHER PUBLICATIONS

Bluhm et al., Nature, Vol. 215, pp. 1478–1479, (1967).

*Primary Examiner*—Norman G. Torchin
*Assistant Examiner*—J. P. Brammer

[57] ABSTRACT

Variable depth, positive, contour images are produced on substrates by coating the substrate with a photopolymerizable coating composition containing (1) a non-gaseous, ethylenically unsaturated compound capable of polymerization by free-radical initiated chain propagation, (2) an organic light-sensitive free-radical generating system, and (3) a photodissociable nitroso dimer having a dissociation constant of about $10^{-2}$ to $10^{-10}$ and a dissociation half-life of at least about 30 seconds in solution at 25°C. These images are produced by exposing the photopolymerizable coating to light having wavelengths both above and below 3400A through a transparent film of variable optical density to light having a wavelength of less than about 3400A, and developing a positive polymeric image by removing the nonpolymerized portion of the polymer coating.

9 Claims, No Drawings

METHOD OF USING VARIABLE DEPTH PHOTOPOLYMERIZATION IMAGING SYSTEMS

BACKGROUND OF THE INVENTION

1. Field of the Invention

This invention relates to a method of producing contour images from photopolymerizable compositions containing nitroso dimers.

2. Description of the Prior Art

It is known that aromatic nitroso compounds are useful as polymerization inhibitors. For example, Hungarian Pat. No. 150,550 (1963) describes the use of p-aminonitrosobenzene and α-nitroso-β-napthol as inhibitors for the free radical polymerization of styrene. It is also known that N-nitrosocyclohexylhydroxylamine salts serve as thermal polymerization inhibitors in the preparation of photopolymers (U.S. Pat. No. 3,625,696, Dec. 7, 1971). Similarly, the use of 4-nitrosophenol, 1,4-dinitrosobenzene, nitrosoresorcinol, p-nitrosodimethylaniline and other nitroso monomers as inhibitors for styrene and vinyl acetate polymerizations is described by Hartel in Chimia (Aarau), 19, p. 116 (1965), and Tudos et al., in Kinetika i Kataliz., 6, p. 203 (1965). Heiart, U.S. Pat. No. 3,203,801, patented Aug. 31, 1965, has described the use of N-substituted p-nitrosoanilines as sensitometric modifiers in photopolymerization systems.

It is also known that aliphatic nitroso dimers can be dissociated to monomers, either thermally or by irradiation with short wavelength ultraviolet light (Bluhm and Weinstein, Nature, 215, p. 1478, 1967). Photolysis of nitroso monomers has been reported to produce nitroxides, and it is known that a nitroxide is formed when alkyl radicals add to a nitroso compound (Mackor et al., Tetrahedron Letters, p. 2115, 1966).

In U.S. Pat. application Ser. No. 384,501, filed Aug. 1, 1973 W. J. Nebe describes a method of making a positive image on a substrate by coating the substrate with a photopolymerizable coating composition containing (1) a non-gaseous ethylenically unsaturated compound capable of addition polymerization by free-radical initiated chain propogation; (2) 0.001 to 1.0 part by weight per part of polymerizable compound of an organic light-sensitive free-radical generating system; and (3) 0.1 to 10 percent by weight based on the coating composition of a photodissociable nitroso dimer having a dissociation constant of $10^{-2}$ to $10^{-10}$ and a dissociation half-life of at least about 30 seconds in solution at 25°C., imagewise exposing a portion of the photopolymerizable coating to ultraviolet light at least some of which has a wavelength of less that about 3400°A, through an image-bearing transparency consisting solely of substantially opaque and substantially transparent areas, thereby forming nitroso monomer by photodissociation of the nitroso dimer, exposing a greater portion of the coating, including the portion struck by light having a wavelength of less than about 3400A, to light substantially limited to wavelengths greater that about 3400A, and developing a positive polymeric image by removing the nonpolymerized portion of the polymer coating.

SUMMARY OF THE INVENTION

It has now been discovered that variable depth, positive, contour images can be produced on a substrate by the process which comprises coating the substrate with a photopolymerizable coating composition containing (1) a non-gaseous, ethylenically unsaturated compound capable of addition polymerization by free-radical initiated chain propagation, (2) about 0.001 to 1.0 part by weight per part of polymerizable compound of an organic light-sensitive, free-radical generating system, and (3) about 0.1 to 10 percent by weight based on the coating composition of a photodissociable nitroso dimer having a dissociation constant of $10^{-2}$ to $10^{-10}$ and a dissociation half-life of at least about 30 seconds in a solution at 25°C., exposing the photopolymerizable coating to light having wavelengths both above and below 3400A through a transparent film of variable optical density to light having a wavelength of less than about 3400A, and developing a positive polymeric image by removing the nonpolymerized portion of the polymer coating.

DETAILED DESCRIPTION OF THE INVENTION

The present invention is based on the fact that nitroso dimers are not free radical polymerization inhibitors, but are dissociated to active inhibiting mononitroso species by ultraviolet light of wavelength about 2800–3400A. The dimers are relatively unaffected by light of longer wavelength.

On the other hand, light-sensitive free-radical initiators absorb light of longer wavelength to provide sufficient radicals for polymerization of the monomer in the absence of an appreciable concentration of mononitroso species. The nitroso monomer formed by irradiation of nitroso dimer with short wavelength light interferes with the normal free-radical induced polymerization process by reaction with radicals or with photoactivated nitroso monomers to form stable nitroxide radicals which do not propagate a radical chain process. Hence, these nitroxide radicals serve as efficient chain terminators. The processes believed to be operable are outlined in equations 1 – 3, wherein RNO* represents an excited mononitroso species.

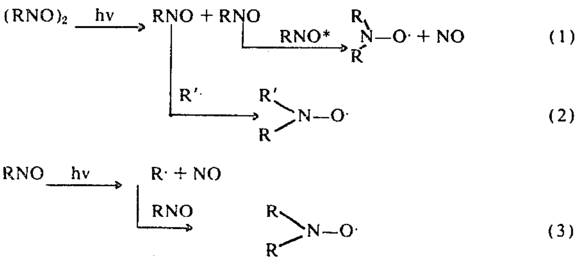

Since the extinction coefficients of the initiator systems are relatively low at the longer wavelengths, generation of initiating radicals is not as depth dependent as is generation of mononitroso inhibitors. Hence, selection of a transparent film of variable optical density toward short wavelength ultraviolet light permits selective dissociation of nitroso dimer as a function of depth of the photopolymerizable layer resulting in a graded polymerization. The transparency passes light of longer wavelength which effects polymerization. The amount of polymer formed on the base is inversely proportional to the optical density of that part of the transparency through which the light passes, and a contour image is produced.

The photopolymerizable coating compositions used in accordance with this invention must contain (1) a polymerizable compound, (2) an organic light-sensitive free-radical generating system and (3) a photodissociable nitroso dimer. Suitable polymerizable compounds are the non-gaseous, ethylenically unsaturated compounds capable of addition polymerization by free-radical initiated chain propagation described in Burg et al., U.S. Pat. No. 3,060,023; Martin et al., U.S. Pat. No. 2,927,022; and in the coassigned patent application of Hertler, Ser. No. 299,471, filed Oct. 20, 1972 now U.S. Pat. No. 3871885. The photocrosslinkable polymers disclosed in Schoenthaler, U.S. Pat. No. 3,418,295, and Celeste, U.S. Pat. No. 3,448,089, may also be used. They are preferably monomeric, have a boiling point above about 90°C. at normal atmospheric pressure, and contain at least one terminal ethylenic group, but may contain 2 – 5 terminal ethylenic groups. Monomers which contain three terminal ethylenic groups are preferred.

Suitable unsaturated compounds include unsaturated esters of polyols, particularly such esters of α-methylenecarboxylic acids, for example, ethylene glycol diacrylate, diethylene glycol diacrylate, glycerol diacrylate, glyceryl triacrylate, mannitol polyacrylate, sorbitol polyacrylates, ethylene glycol dimethacrylate, 1,3-propanediol dimethacrylate, 1,2,4-butanetriol trimethacrylate, trimethylolpropane triacrylate, triethylene glycol diacrylate, 1,4-cyclohexanediol diacrylate, 1,4-benzenediol dimethacrylate, pentaerythritol di-, tri-, and tetramethacrylate, dipentaerythritol polyacrylate, pentaerylthritol di-, tri-, and tetraacrylates, 1,3-propanediol diacrylate, 1,5-pentanediol dimethacrylate, the bis-acrylates and methacrylates of polyethylene glycols of molecular weight 200 – 4000, and the like; unsaturated amides, particularly those of α-methylenecarboxylic acids, and especially those of α-, ω-diamines and oxygen-interrupted ω-diamines, such as methylene bis-acrylamide, methylene bis-methacrylamide, ethylene bis-methacrylamide, 1,6-hexamethylene bis-acrylamide, bis-(γ-methacrylamidopropoxy)ethane and β-methacrylamidoethyl methacrylate; vinyl esters such as divinyl succinate, divinyl adipate, divinyl phthalate, divinyl terephthalate, divinyl benzene-1,3-disulfonate and divinyl butane-1,4-disulfonate; styrene and derivatives thereof, and unsaturated aldehydes, such as hexadienal.

A preferred group of polymerizable compounds, because of the good physical properties of compositions containing them include N-phenyl-N-methylacrylamide, N-vinylphthalimide, diacetone acrylamide, N-vinylsuccinimide, p-xylylene diacrylate, 1,4-bis(2-acryloxyethyl)benzene, pentaerythritol triacrylate, 4-acryloxybenzophenone, 4-methacryloxybenzophenone, N-(2-acryloxyethyl)succinimide, trimethylolpropane triacrylate, pentaerythritol tetraacrylate, triethylene glycol diacrylate, triethylene glycol dimethacrylate, trimethylolpropane trimethacrylate, 4-acryloxydiphenylmethane, N-(2-acryloxypropyl)succinimide, 2,4-diacryloxybenzophenone, 4-(α,α-dimethylbenzyl)phenyl acrylate, 3-acryloxybenzophenone, 2-acryloxybenzophenone, and 2-acryloxy-4-octyloxybenzophenone.

The second component which the photopolymerizable coating composition must contain is an organic, light-sensitive, free-radical generating system which initiates the polymerization of the monomer and does not subsequently terminate the polymerization. The word "organic" is used here and in the claims to designate compounds which contain carbon, and one or more of oxygen, hydrogen, nitrogen, sulfur and halogen, but are free of metal.

The free-radical generating system absorbs light within the range of about 2000 to 8000A and has at least one component that has an active light absorption band with a molar extinction coefficient of at least about 50 within the range of about 3400 to 8000A, and preferably 3400 to 5000A. "Active light absorption band" means a band of light which is active to produce the free radicals necessary to initiate the polymerization of the monomeric material. The free radical generating system can comprise one or more compound which directly furnishes free radicals when activated by light. It can also comprise a plurality of compounds, one of which yields the free radicals after having been caused to do so by a sensitizer which is activated by the light.

A large number of such compounds can be utilized in the practice of this invention including aromatic ketones such as benzophenone, Michler's ketone (4,4'-bis(dimethylamino)benzophenone), 4,4'-bis(diethylamino) benzophenone, 4-acryloxy-4'-dimethylaminobenzophenone, 4-acryloxy-4'-diethylaminobenzophenone, 4-methoxy-4'-dimethylaminobenzophenone, and other aromatic ketones; benzoin, benzoin ethers such as benzoin methyl ether, benzoin ethyl ether and benzoin phenyl ether, methylbenzoin, ethylbenzoin and other benzoins; and 2,4,5-triarylimidazole dimers such as 2-(o-chlorophenyl)-4,5-diphenylimidazole dimer, 2-(o-chlorophenyl)-4,5-di(m-methoxyphenyl)imidazole dimer, 2-(o-fluorophenyl)-4,5-diphenylimidazole dimer, 2-(o-methoxyphenyl)4,5-diphenylimidazole dimer, 2-(p-methoxyphenyl)-4,5-diphenylimidazole dimer, 2,4-di(p-methoxyphenyl)-5-phenylimidazole dimer, 2-(2,4-dimethoxyphenyl)-4,5-diphenylimidazole dimer, 2-(p-methylmercaptophenyl)-4,5-diphenylimidazole dimer, and the like disclosed in U.S. Pat. No. 3,479,185 and in British Pat. No. 997,396, published July 7, 1965, and 1,047,569, published Nov. 9, 1966.

The imidazole dimers may be used with compounds such as 2-mercaptobenzoxazole with or without sensitizers such as Michler's ketone and various dyes. Additional examples of suitable initiators are disclosed by Plambeck in U.S. Pat. No. 2,760,863. Redox systems, especially those involving dyes, may also be used. These include combinations such as Rose Bengal/2-dibutylaminoethanol; 2-o-chlorophenyl-4,5-di(m-methoxyphenyl)imidazole dimer/2-mercaptobenzoxazole, and the like.

A preferred group of free-radical generating systems characterized by good efficiency includes methyl, ethyl and phenyl benzoin ethers, methylbenzoin and its ethers, Michler's ketone and its analogs, 2,4,5-triarylimidazole dimers/2-mercaptobenzoxazole, and phenanthraquinone. The concentration of the free-radical generating system employed should be about 0.001 to 1.0 part by weight for each part by weight of polymerizable compound, preferably about 0.01 to 0.7 part by weight.

The third component which is essential to the photopolymerizable coating composition is a nitroso dimer having a dissociation constant of $10^{-2}$ to $10^{-10}$ and a dissociation half-life of at least 30 seconds in solution at 25°C. The preferred nitroso compounds in the monomeric form, have at least one nitroso group attached to a primary or secondary carbon atom, although certain nitroso compounds wherein the nitroso group is attached to an activated tertiary carbon atom are useful. Compounds containing two or more nitroso groups wherein the association of the nitroso groups is intramolecular rather than intermolecular can also be employed provided the above conditions with respect to dissociation constant are fulfilled.

Examples of nitroso compounds, the formulas of which are written for convenience in the monomeric form except where the association is intramolecular, include:

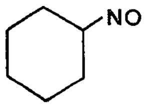

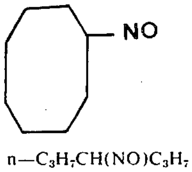

NO
|
$CH_3CHCO_2C_2H_5$
$C_2H_5CHCO_2C_2H_5$
|
NO $n-C_3H_7CH(NO)C_3H_7$ $(CH_3)_2CHNO$ $CH_3CH(NO)C_2H_5$ $n-C_4H_9CH(NO)CO_2C_2H_5$ $(CH_3)_2CHCH_2CH_2CH(NO)CO_2C_2H_5$

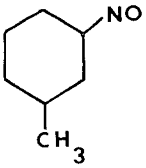

$C_2H_5O_2CCH_2CH(NO)CO_2C_2H_5$
$(CH_3)_2CHCH(NO)CH_3$
$CH_3COCH(CO_2C_2H_5)CH(NO)CO_2C_2H_5$
$CH_3COCH(NO)COC_6H_5$
$C_6H_5COCH(NO)COC_6H_5$
$p-CH_3OC_6H_4COCH(NO)COC_6H_5$ $CH_3$
|
NC—C—NO
|
$CH_3$

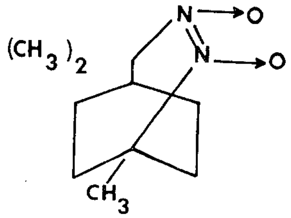

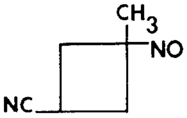

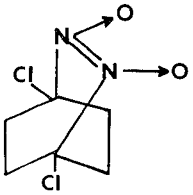

$CH_3CO_2CH—CH(NO)CH_3$

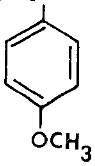

$CH_3CO_2CHCH(NO)CH_3$

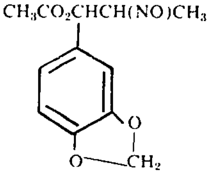

$CH_3CO_2CHCH(NO)CH_3$

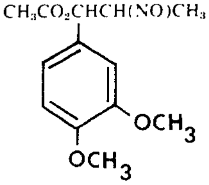

$CH_3CO_2CHCH(NO)CH_3$

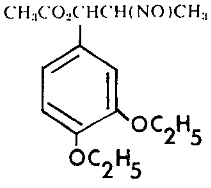

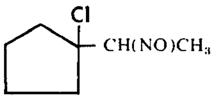

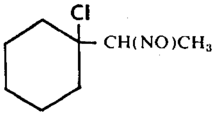

$n-C_4H_9CH(NO)CH_2CH_2CH_2OH$

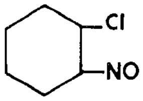

$n-C_6H_{13}CH(NO)CH_3$ $CH_3CH(NO)Cl$

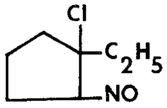

$HO(CH_2)_6NO$
$(CH_3)_3CCH_2CH(NO)C(CH_3)_2ONO_2$
$CH_3CH(Cl)CH(NO)CH_3$

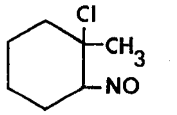

$CH_3CH(Cl)CH(NO)C_2H_5$ $C_6H_5CH(Cl)CH(NO)CH_3$

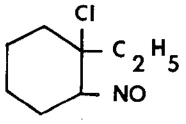

$(CH_3)_2C(Cl)CH(NO)CH_3$

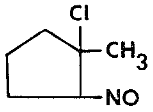

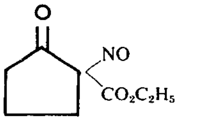

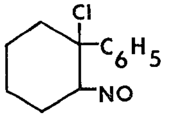

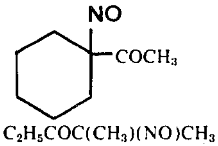

$(CH_3)_2CHCOC(CH_3)(NO)CH_3$ $C_2H_5COC(CH_3)(NO)CH_3$ $CH_3COC(CH_3)(NO)CH_3$

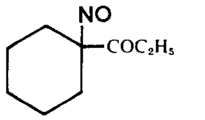

$(CH_3)_2CHCH_2COC(CH_3)(NO)CH_3$

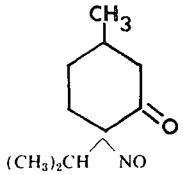

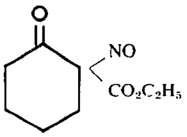

$C_6H_5COC(CH_3)(NO)CO_2C_2H_5$

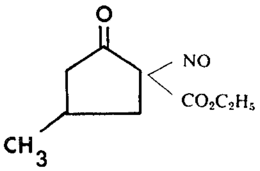

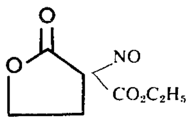

$[(CH_3)_3C]_2CHNO$ $CH_3C(CH(CH_3)_2)_2CH_2NO$
$CH_3(CH_2)_{16}CH_2NO$ $CH_3NO$

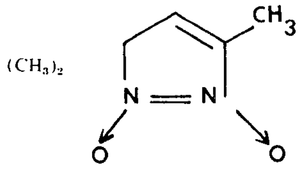

$CH_3(CH_2)_{10}CH_2NO$

The nitroso dimers are ordinarily employed in concentrations of about 0.1 to 10 percent by weight based on the coating composition. The preferred amount in any specific case will depend upon the particular monomer/initiator system employed and whether it is a simple system, a binder system or an essentially crystalline system. In general, the preferred amount of nitroso dimer will be about 0.2 to 2 percent by weight based on the coating composition.

The coating compositions used herein can also contain other components, if desired. For example, the coating can be of the monomer/binder type containing additionally a thermoplastic macromolecular organic polymer binder. The coating can also be of the substantially dry, predominately crystalline type, described in the coassigned patent application of Hertler, Ser. No. 299,471, filed Oct. 20, 1972, which contains a solid ethylenically unsaturated compound, an organic light-sensitive free radical generating system, and a nonpolymeric normally liquid or solid organic substance which does not inhibit the polymerization of the monomer, in addition to a suitable nitroso dimer.

Suitable thermoplastic macromolecular organic polymer binders for use in a monomer/binder system are described in Chang, U.S. Pat. No. 3,661,588, and include such polymeric types as (a) copolyesters based on terephthalic, isophthalic, sebacic, adipic and hexahydroterephthalic acids; (b) nylons or polyamides; (c) vinylidene chloride copolymers; (d) ethylene/vinyl acetate copolymers; (e) cellulosic ethers; (f) polyethylene; (g) synthetic rubbers; (h) cellulose esters; (i) polyvinyl esters including polyvinyl acetate/acrylate and polyvinyl acetate/methacrylate copolymers; (j) polyacrylate and $\alpha$-alkylpolyacrylate esters, e.g., polymethyl methacrylate and polyethyl methacrylate; (k) high molecular weight polyethylene oxides of polyglycols having average molecular weights from 4000–1,000,000; (l) polyvinyl chloride and copolymers; (m) polyvinyl acetal; (n) polyformaldehydes; (o) polyurethanes; (p) polycarbonates; (q) polystyrenes. A preferred group of binders includes the polyacrylates and $\alpha$-alkylacrylate esters, particularly polymethyl methacrylate. When a monomer or monomer/binder system is employed, the weight ratio of polymerizable constituent to binder can be from about 100/0 to 3/97.

When the substantially dry, predominantly crystalline system, described in the copending application of Hertler, is employed, in one aspect of the invention the system may contain in addition to the polymerizable compound, about 0.01 to 0.25 part by weight, per part of polymerizable compound, of a nonpolymeric, normally liquid, organic compound which does not inhibit polymerization of the polymerizable compound and does not absorb so much incident light as to prevent initiation of polymerization by the free-radical generating system. In another aspect of the invention, about 0.01 to 250 parts by weight, per part of polymerizable compound, of a nonpolymerizable, crystalline organic solid which does not inhibit polymerization of the polymerizable compound and does not absorb incident light to such an extent as to prevent initiation of polymerization by the free-radical generating system may be added.

Illustrative examples of organic compounds which may be added include octadecanol, triethanolamine, stearic acid, cyclododecane, 1,10-decanediol, dimethylaminobenzonitrile, acetone oxime, desoxybenzoin, napthalene, N,N'-dimethylhexamethylenediamine, p-diethoxybenzene, 1,2-diphenylethane, biphenyl, dotriacontane, tetramethylurea, tributylamine, 2-dimethylaminoethanol, bibenzyl, pentamethylbenzene, 1,12-dodecanediol, 1,2-diphenoxyethane, octacosane, trichloroxylene, cyclododecanol, and the like.

A preferred group of solid compounds includes bibenzyl, biphenyl, 1,2-diphenoxyethane, p-diethoxybenzene, octacosane, 1-octadecanol and cyclododecanol.

The photopolymerizable compositions described herein may be coated on a wide variety of substrates. By "substrate" is meant any natural or synthetic support which is capable of existing in film or sheet form and can be flexible or rigid. For example, the substrate could be a metal sheet or foil, a sheet or film of synthetic organic resin, cellulose paper, fiberboard, and the like, or a composite of two or more of these materials. Specific substrates include alumina-blasted aluminum, alumina-blasted Mylar polyester film Mylar polyester film, polypropylene film, polyvinyl alcohol-coated paper, crosslinked polyester-coated paper, nylon, glass, heavy paper such as lithographic paper, and the like.

The particular substrate will generally be determined by the use application involved. When the photopolymerizable compositions are coated on metal surfaces, they may be useful for making presensitized lithographic and gravure printing plates. For example, use of a grained aluminum base in combination with a photopolymerizable coating results in a developed lithographic plate. The plate is first coated with water and is then contacted with a roller which wets only the photopolymer image with ink. The inked plate can then be used in a lithographic printing step in the usual way.

The coated compositions can also serve as photoresists in making etched or plated circuits or in chemical milling applications. They are also useful for preparing colored images from color separation negatives suitable for color-proofing. The images formed with these elements may also be used for making copies by thermal transfer to a substrate. Specific uses will be evident to those skilled in the art; many uses are disclosed in U.S. Pat. Nos. 2,760,863; 3,060,023; and 3,060,026.

Processes for coating the substrate are described in the patents listed in the preceding paragraph. Processes for coating, using coating compositions of the substantially dry, predominantly crystalline type, are of five general types in which (1) the components of the coating composition are melted together generally to form a homogeneous melt which is coated onto the substrate; (2) the components of the coating composition are dissolved together in a solvent in which the components are preferably completely soluble and the resulting solution is poured or painted onto the substrate; (3) the components of the coating composition are dissolved in a volatile solvent and the resulting solution is then sprayed as a fine mist against the substrate; (4) the components of the coating composition are melted together and the melt is sprayed as a fine mist onto the substrate; (5) the components of the coating composition are mixed together in a vessel which can be heated and which contains an inner surface that can be cooled and whose distance from the mixture can be varied and in which the components are subsequently sublimed onto the cooled surface. Further details of these processes can be found in the copending application of Hertler, cited above. A preferred coating method involves solution coating as in (2) above. Preferred solvents include chlorinated hydrocarbons.

The compositions of the invention are exposed to light of wavelength in the 2000–8000A range, containing wavelengths both above and below 3400A. Suitable sources of such light, in addition to sunlight, include carbon arcs, mercury-vapor arcs, fluorescent lamps with ultraviolet radiation-emitting phosphors, argon glow lamps, electronic flash units and photographic-flood lamps. Other fluorescent light sources such as the tracings on the face of a cathode ray tube may be used. Electron accelerators and electron beam sources through an appropriate mask may also be used.

Where artificial light sources are used, the distance between the photosensitive layer and the light source may be varied according to the light sensitivity of the composition and the nature of the photopolymerized polymer. Customarily, mercury-vapor arcs are used at a distance of 1½ to 20-inches from the photopolymerizable layer. Light fluxes of 10–10,000$\mu$w/cm$^2$ are generally suitable for use.

Imagewise exposure, for example, in preparing printing plates, is conveniently carried out by exposing a layer of the photoactive composition to light through a process transparency of variable optical density to ultraviolet light. Process transparencies may be constructed of any suitable materials including cellulose acetate film and Mylar polyester film. An example is in the preparation of a positive working lithographic plate using the novel system. Exposure of a plate coated with the nitroso dimercontaining photoactive composition to the full spectrum of a mercury-vapor lamp through a cellulose acetate or Mylar polyester film negative causes dissociation of the nitroso dimer to nitroso monomer to a depth dependent upon the density of short wavelength light.

The length of time for which the compositions are exposed to light may vary upward from fractions of a second. The exposure times will vary, in part, according to the nature and concentration of the polymerizable compound and initiator and the type of light, and the nature and concentration of nitroso dimer present. Exposure temperatures are not particularly critical so long as the equilibrium concentration of nitroso monomer remains at a low level. Hence, temperatures below about 45° are used, preferably about 20°–35°C. There is an obvious economic advantage to operating the process at room temperature.

The exposed photosensitive layer is developed by removing the unpolymerized ethylenically unsaturated compound from the coating and leaving behind only the polymeric replica of the original. The polymeric image may be developed by solvent washout, thermal transfer, pressure transfer, differential adhesion of the exposed versus unexposed areas, heating under conditions such that some or all of the volatile components are vaporized leaving behind the photopolymer, and so forth. The conditions of thermal development selected will depend upon the nature of the substrate, the volatility of the components to be removed, and the thermal stability of the components. Preferably solvent washout development is used.

EXAMPLE OF THE INVENTION

The following example, illustrating the novel method of this invention, is given without any intention that the invention be limited thereto.

A stock solution was prepared as follows:
9.65 g of trimethylolpropane triacrylate
0.25 g of benzoin methyl ether
0.1 g of nitrosocyclohexane dimer The solution was used to prepare films on four microscope slides which contained a 10-mil Mylar polyester film rim. The coated microscope slides were covered with quartz plates and ultraviolet stepwedge negatives. The films were irradiated with a 275 W RS sunlamp for 5 minutes from a distance of 12 inches. The negatives were prepared by staggering six layers of cellulose acetate butyrate film, each layer absorbing 50% of short wavelength light as shown in the diagram. The numbers

| 100% | 50% | 25% | 12.5% | 6% | 3% | 1.5% |
|---|---|---|---|---|---|---|
| 1 | 2 | 3 | 4 | 5 | 6 | 7 |

represent the percent of the short wavelength light transmitted.

Unpolymerized monomer was removed with an acetone washout. The films showed seven visible steps with the most complete polymerization occurring where the least amount of short wavelength light was transmitted. Each step differed on the average by 0.5 mil thickness.

| Run | Steps (Thickness in Mils) | | | | | | |
|---|---|---|---|---|---|---|---|
| | 1 | 2 | 3 | 4 | 5 | 6 | 7 |
| 1 | 6.0 | | | 8.0 | | | 9.5 |
| 2 | 6.0 | | | 7.9 | | | 9.1 |
| 3 | 6.1 | | | 8.0 | | | 9.0 |
| 4 | 5.3 | | | 10.0 | | | 11.0 |

Although the invention has been described and exemplified by way of a specific embodiment, it is not intended that it be limited thereto. As will be apparent to those skilled in the art, numerous modifications and variations of this embodiment can be made without departing from the spirit of the invention or the scope of the following claims.

I claim:

1. Method of making a variable depth, positive, contour image on a substrate which comprises coating the substrate with a photopolymerizable coating composition containing (1) a non-gaseous, ethylenically unsaturated compound capable of addition polymerization by free-radical initiated chain propagation; (2) 0.001 to 1.0 part by weight per part of polymerizable compound of an organic light-sensitive free-radical generating system; and (3) 0.1 to 10 percent by weight based on the coating composition of a photodissociable nitroso dimer having a dissociation constant of $10^{-2}$ to $10^{-10}$ and a dissociation half-life of at least 30 seconds in solution at 25°C, exposing the photo-polymerizable coating to light having wavelengths both above 3400A which effect polymerization and below 3400A which diisociate nitroso dimer to nitroso monomer, through a transparent film of variable optical density to light having a wavelength of less than 3400A and transparent to light having a wavelength above 3400A, and developing a variable depth, positive, polymeric, contour image by removing the nonpolymerized portion of the polymer coating.

2. The method of claim 1 in which the polymerizable compound is an unsaturated ester of a polyol and an α-methylenecarboxylic acid.

3. The method of claim 2 in which the polymerizable compound is an acrylic ester.

4. The method of claim 3 in which the coating composition contains 0.01 to 0.7 part by weight per part of polymerizable compound of a benzoin ether as the free-radical generating system.

5. The method of claim 4 in which the free-radical generating system is benzoin methyl ether.

6. The method of claim 4 in which the coating composition contains 0.2 to 2 percent by weight based on the coating composition of 2,4-dimethyl-2-nitroso-3-pentanone dimer.

7. The method of claim 4 in which the coating composition contains 0.2 to 2 percent by weight based on the coating composition of nitrosocyclohexane dimer.

8. The method of claim 4 in which the coating composition contains 0.2 to 2 percent by weight based on the coating composition of 1-nitroso-3-methylcyclohexane dimer.

9. The method of claim 4 in which the coating composition contains 0.2 to 2 percent by weight based on the coating composition of 2-nitroso-3-methylbutane dimer.

* * * * *